(12) United States Patent
Lian et al.

(10) Patent No.: US 6,596,580 B2
(45) Date of Patent: Jul. 22, 2003

(54) RECESS PT STRUCTURE FOR HIGH K STACKED CAPACITOR IN DRAM AND FRAM, AND THE METHOD TO FORM THIS STRUCTURE

(75) Inventors: Jingyu Lian, Walkkill, NY (US); Greg Costrini, Hopewell Junction, NY (US); Laertis Economikos, Wappingers Falls, NY (US); Michael Wise, Lagrangeville, NY (US)

(73) Assignees: Infineon Technologies AG (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/982,574

(22) Filed: Oct. 18, 2001

(65) Prior Publication Data

US 2003/0077858 A1 Apr. 24, 2003

(51) Int. Cl.[7] .............. H01L 21/8242; H01L 21/00

(52) U.S. Cl. ............... 438/253; 438/3; 438/396; 257/303; 257/306; 257/310

(58) Field of Search ............. 438/3, 253–256, 438/396–399; 257/303, 306, 310

(56) References Cited

U.S. PATENT DOCUMENTS

| | | | | |
|---|---|---|---|---|
| 5,381,302 A | * | 1/1995 | Sandhu et al. | 361/305 |
| 6,407,422 B1 | * | 6/2002 | Asano et al. | 257/306 |
| 6,454,860 B2 | * | 9/2002 | Metzner et al. | 118/715 |
| 6,455,424 B1 | * | 9/2002 | McTeer et al. | 438/675 |
| 2002/0084481 A1 | * | 7/2002 | Lian et al. | 257/310 |

* cited by examiner

*Primary Examiner*—John F. Niebling
*Assistant Examiner*—Jennifer M. Kennedy
(74) *Attorney, Agent, or Firm*—Lerner, David, Littenberg, Krumholz & Mentlik, LLP

(57) ABSTRACT

The exposure of the interface between the bottom electrode and barrier layer to a high temperature oxygen ambience is avoided by recessed Pt-in-situ deposited with a barrier layer.

7 Claims, 3 Drawing Sheets

RECESS PT STRUCTURE FOR HIGH K STACKED CAPACITOR IN DRAM AND FRAM, AND THE METHOD TO FORM THIS STRUCTURE

BACKGROUND OF THE INVENTION

The present invention generally relates to integrated circuit (IC) memory devices and, more particularly, to the fabrication of stacked capacitor structures in Dynamic Random Access Memories (DRAMs) and similar devices.

A platinum (Pt) electrode has been used in high k stacked capacitor structures in Dynamic Random Access Memory (DRAM) and Flash Random Access Memory (FRAM) devices because of its high work function. Stacked capacitors are connected to the devices through polycrystalline silicon (polysilicon) plugs (or, more simply, "polyplugs"). A barrier layer is required between bottom Pt electrode and the polyplug to avoid reaction between Pt and polysilicon and the oxidation of the polyplug during the deposition of high k capacitor films. However, after the bottom electrode is patterned by Reactive Ion Etch (RIE), the interface of Pt electrode and barrier layer is exposed, and diffusion of oxygen through the interface has been observed. The interface layer due to oxygen diffusion increases the contact resistance and decreases the capacitance, and therefore should be avoided.

It is therefore an object of the present invention to provide a capacitor structure and method of making the same which avoids the interface layer due to oxygen diffusion.

According to the invention, there is provided a recessed Pt electrode deposited in situ with the barrier layer. Since the barrier layer and Pt electrode are deposited in situ and the most exposed area during Chemical-Mechanical Polish (CMP) is Pt, the formation of an oxide layer on the barrier layer surface during CMP is avoided. There is more space for dielectric film (than a sidewall spacer structure) since the barrier layer is recessed and no spacer is required. The oxygen diffusion path is longer due to the lateral recess of the barrier. The process provides more tolerance to misalignment.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
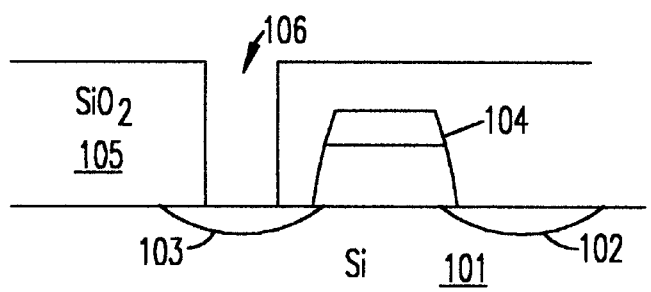
FIGS. 1A to 1H are cross-sectional diagrams showing the process for forming the recess structure according to the invention.

Referring now to the drawings, and more particularly to FIGS. 1A to 1H, there is shown the process for manufacture of the recess Pt structure for a high k stacked capacitor according to the invention. In FIG. 1A, a silicon substrate 101 has formed therein the source 102 and drain 103 of a transistor device. Between the source and drain is a gate 104 of the transistor device. The entire substrate is covered with a layer 105 of silicon dioxide ($SiO_2$). A stacked capacitor is to be connected to the drain 103, and to make that connection, a contact via 106 is formed in the $SiO_2$ layer 105 extending to the drain 103.

Figure 1B:
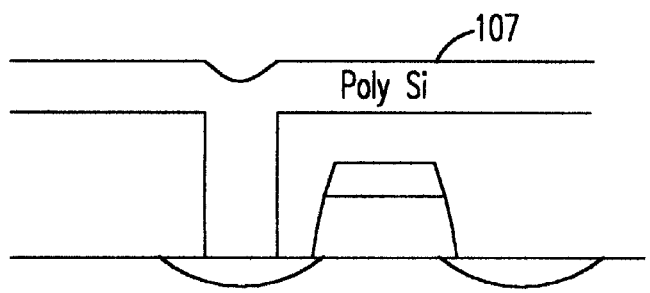
Figure 1C:
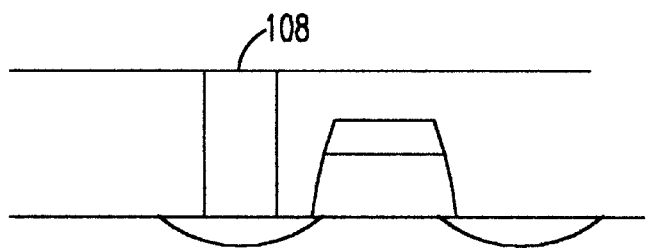
Figure 1D:
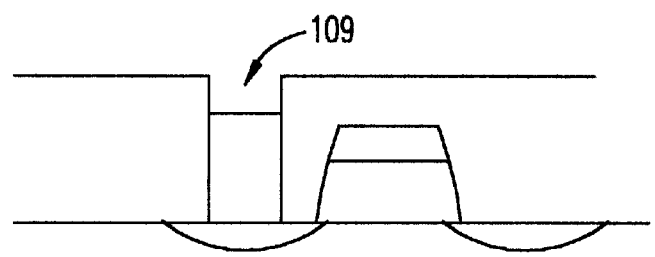

The contact via 106 is filed with polysilicon 107 in FIG. 1B, and the resulting structure is planarized using CMP in FIG. 1C. This leaves a polyplug 108 in the contact via 106, and this polyplug 108 is recessed by a polysilicon etch to form a recess 109 in FIG. 1D.

Figure 1E:
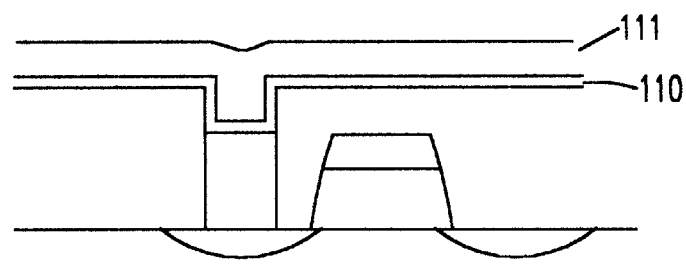
Figure 1F:
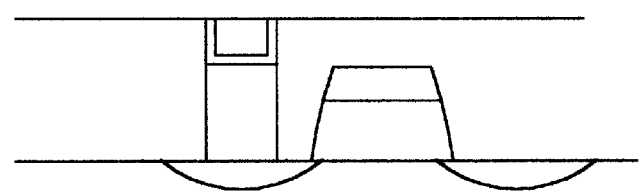
Figure 1G:
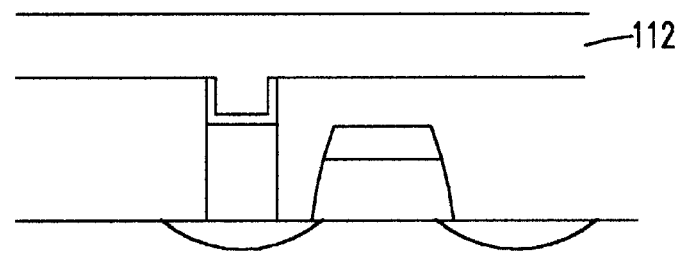
Figure 1H:
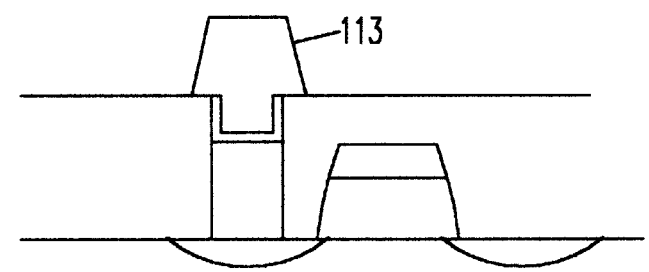

At this point in the process, a barrier 110 and the metal 111 which will form the bottom electrode of the stacked capacitor are deposited in situ, as shown in FIG. 1E. The composition of barrier 110 is preferably tantalum silicon nitride (TaSiN). The metal 111 is Pt in the preferred embodiment, but other metals including ruthenium (Ru) and iridium (Ir) and metal oxides of ruthenium ($RuO_2$) and iridium ($IrO_2$) can be used to form the electrode. The structure is then planarized using CMP in FIG. 1F, and then a metal 112 is deposited in FIG. 1G. If Pt is used as the metal 111, the metal 112 is also Pt. The deposited metal 112 is patterned in FIG. 1H using RIE to form the metal electrode 113.

Figure 2:
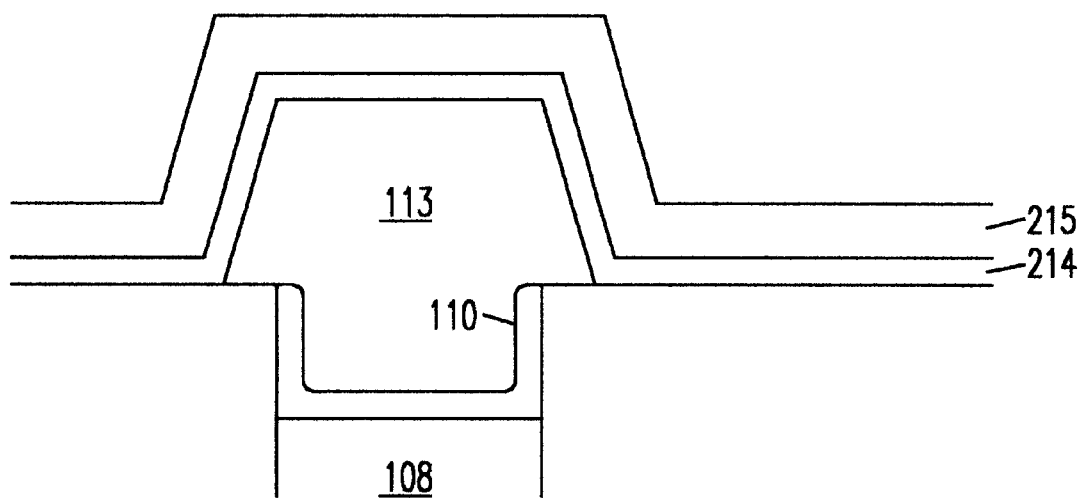
FIG. 2 is a cross-sectional view of the completed capacitor structure.

The stacked capacitor structure is completed in FIG. 2 by depositing a high k dielectric 214 followed by depositing a Pt top electrode 215. The composition of the high k dielectric 214 can be (Ba, Sr)$TiO_3$, $BaTiO_3$, $SrTiO_3$, Pb(Zr, Ti)$O_3$Sr, $Bi_2Ta_2O_9$. The top electrode may then be patterned as needed for the final DRAM or FRAM device.

By forming a recess in which the barrier layer and Pt electrode are deposited in situ, the most exposed area during CMP is Pt. Therefore, the formation of an oxide layer on the barrier layer surface during CMP is avoided in FIG. 1F. The result is a capacitor structure with reduced contact resistance and increased capacitance.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of forming a high k stacked capacitor in a semiconductor memory device comprising the steps of:

forming a contact via in a $SiO_2$ layer covering a transistor device; filling the contact via with polysilicon to form a polyplug in the contact via; etching an exposed surface of the polyplug to form a recess; depositing in situ a barrier layer and a first metal or metal oxide layer; chemical-mechanical polishing to leave a planarized surface with a the barrier layer and the first metal or metal oxide filling the recess;

depositing a second metal or metal oxide layer and patterning the second metal or metal oxide layer to form a bottom electrode in contact with the first metal or metal oxide within the recess; and depositing a high k material and a third metal or metal oxide layer to form the top electrode of the stacked capacitor.

2. The method of forming a high k stacked capacitor in a semiconductor memory device of claim 1, wherein the first, second and third metal layers are selected from the group consisting of Pt, Ir, Ru, $RuO_2$, and $IrO_2$.

3. The method of forming a high k stacked capacitor in a semiconductor memory device of claim 2, wherein the first, second and third metal layers are Pt.

4. The method of forming a high k stacked capacitor in a semiconductor memory device of claim 1, wherein the barrier layer is TaSiN.

5. The method of forming a high k stacked capacitor in a semiconductor memory device of claim 1, wherein the high k dielectric is selected from the group consisting of (Ba, Sr)$TiO_3$, $BaTiO_3$, $SrTiO_3$, Pb(Zr, Ti)$O_3$, and $Bi_2Ta_2O_9$.

6. The method of forming a high k stacked capacitor in a semiconductor memory device of claim 5, wherein the first, second and third metal layers are Pt.

7. The method of forming a high k stacked capacitor in a semiconductor memory device of claim 6, wherein the barrier layer is TaSiN.

* * * * *